United States Patent

Sandhu et al.

[11] Patent Number: 6,140,860
[45] Date of Patent: Oct. 31, 2000

[54] THERMAL SENSING CIRCUIT

[75] Inventors: Bal S. Sandhu, Fremont State; Dennis Reinhardt, Palo Alto, both of Calif.

[73] Assignee: Intel Corporation, Santa Clara, Calif.

[21] Appl. No.: 09/149,698

[22] Filed: Sep. 8, 1998

Related U.S. Application Data

[63] Continuation-in-part of application No. 09/001,608, Dec. 31, 1997, Pat. No. 6,072,349, and a continuation-in-part of application No. 09/001,606, Dec. 31, 1997, Pat. No. 6,006,169.

[51] Int. Cl.⁷ .............................. H03K 17/14; H01L 35/00
[52] U.S. Cl. ...................... 327/513; 702/132; 374/178; 341/144
[58] Field of Search ...................................... 327/513, 512, 327/83, 103; 702/132; 374/178; 341/136, 144, 153

[56] References Cited

U.S. PATENT DOCUMENTS

| | | | |
|---|---|---|---|
| 4,827,260 | 5/1989 | Sugawa et al. ........................ | 341/144 |
| 5,094,546 | 3/1992 | Tsuji ....................................... | 374/178 |
| 5,706,006 | 1/1998 | Hattori ................................... | 341/144 |
| 5,710,519 | 1/1998 | McCalpin et al. ..................... | 327/513 |
| 5,838,578 | 11/1998 | Pippin ................................... | 327/512 |
| 5,940,785 | 1/1998 | Georgiou et al. ...................... | 702/132 |
| 5,961,215 | 10/1999 | Lee et al. ............................... | 374/178 |
| 5,963,079 | 10/1999 | Hoang ................................... | 327/512 |
| 5,980,106 | 11/1999 | Yamamoto et al. ................... | 374/178 |

*Primary Examiner*—Timothy P. Callahan
*Assistant Examiner*—Terry L. Englund
*Attorney, Agent, or Firm*—Trop, Pruner & Hu, P.C.

[57] ABSTRACT

An apparatus for use with a semiconductor substrate includes a digital interface, a digital-to-analog converter and a thermal sensor circuit. The digital interface stores a value that indicates a desired thermal threshold, and the digital-to-analog converter provides an analog signal that indicates the value. The thermal sensor circuit uses the analog signal to set the desired thermal threshold and indicate when a temperature of the substrate exceeds the thermal threshold.

27 Claims, 3 Drawing Sheets

THERMAL SENSING CIRCUIT

CROSS REFERENCE TO RELATED APPLICATIONS

This is a continuation-in-part of U.S. patent application Ser. Nos. 09/001,608 (issued as U.S. Pat. No. 6,072,349 on Jun. 6, 2000), and 09/001,606, (issued as U.S. Pat. No. 6,006,169 on Dec. 21, 1999) which were both filed on Dec. 31, 1997.

BACKGROUND

The invention relates to a thermal sensing circuit.

Referring to FIG. 1, a thermal sensing circuit 10 might be used to, for example, monitor a substrate temperature of a microprocessor 12. When the temperature exceeds a predetermined temperature threshold (100° C., for example), the thermal sensing circuit 10 might alert circuitry of a computer system so that corrective action (throttling back or shutting down the microprocessor 12, for example) may be taken to reduce the temperature. Without the corrective action, the microprocessor 12 may overheat and catastrophic failure of the microprocessor 12 may occur.

The thermal sensing circuit 10 typically is fabricated on a separate discrete integrated circuit, or chip, and is coupled to one or more external pins of the microprocessor 12. Using these pins, the thermal sensing circuit 10 typically biases a thermal sensing element (such as a diode 14, for example) of the microprocessor 12 into forward conduction and senses an analog voltage across the thermal sensing element. This analog voltage indicates the substrate temperature, and the thermal sensing circuit 10 may convert the analog voltage into a digital value that is stored in a register of the circuit 10. As described below, the thermal sensing circuit 10 may use this digital value to determine when the temperature surpasses a maximum temperature threshold.

The temperature threshold may be programmed via a threshold register 23 (of the thermal sensing circuit 10) that may be accessed through a system management bus (SMB) 30. As is typical, the SMB 30 includes an SMBCLK clock line and an SMBDATA data line that may used to store data in and retrieve data from the thermal sensing circuit 10. When the temperature threshold is exceeded, the thermal sensing circuit 10 may assert an SMBALERT# signal (which is carried by another line of the SMB 30) to alert the computer system that corrective action is needed.

To accomplish the above-described functions, the thermal sensing circuit 10 typically includes an analog-to-digital (A/D) converter 16 which receives the analog signal (from the sensing element) and converts the analog signal into the digital value. A digital comparator 24 (of the thermal sensing circuit 10) compares the digital value to a value stored in the threshold register 23 and stores the result of the comparison in a status register 26.

At least two factors may affect the accuracy of the thermal sensing circuit 10, and the A/D converter 16 governs both of these factors. First, the rate at which the thermal sensing circuit 10 samples the temperature of the substrate may not be fast enough to track the microprocessor's temperature in real time. Although a typical measurement rate may be two samples per second (i.e., 2 Hz), the thermal sensing circuit 10 may need to be capable of measuring the temperature at a minimum rate of eight samples per second in order to handle a wide range of thermal management solutions. The sampling rate depends on how fast the temperature may change (i.e., the sampling rate must be greater than or equal to the Nyquist rate), and the required sampling rate may increase as the microprocessor 12 dissipates more power.

Another factor affecting the thermal sensing circuit's accuracy may be the accuracy of the A/D converter 16. In this manner, in order for the thermal sensing circuit 10 to accurately sense the temperature, the A/D converter should exhibit a low quantization error so that the A/D converter 16 does not introduce an error that exceeds ±1° C. Since a temperature coefficient of the thermal sensing element may be 2.2 mV/° C., the resolution of the A/D converter 16 should be at least 1 mV to avoid inaccurate readings due to quantization errors.

Thus, there exists a continuing need for a thermal sensing circuit to accurately sense a substrate temperature.

SUMMARY

In one embodiment, an apparatus for use with a semiconductor substrate includes a digital interface, a digital-to-analog converter and a thermal sensor circuit. The digital interface stores a value that indicates a desired thermal threshold, and the digital-to-analog converter provides an analog signal that indicates the value. The thermal sensor circuit uses the analog signal to set the desired thermal threshold and indicate when a temperature of the substrate exceeds the thermal threshold.

DETAILED DESCRIPTION

Figure 2:
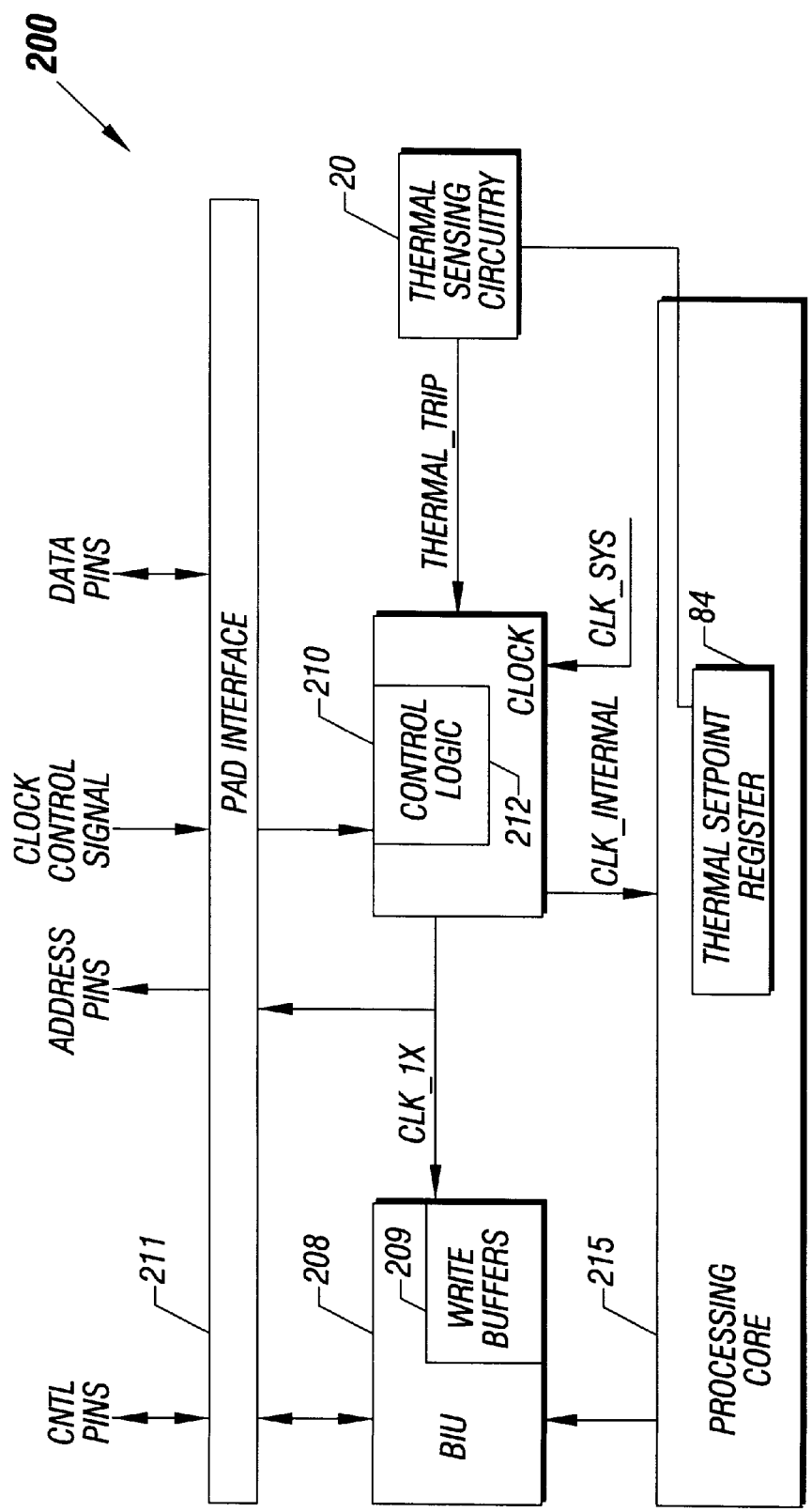
FIG. 2 is a schematic diagram of a microprocessor according to an embodiment of the invention.

Referring to FIG. 2, an embodiment 200 of a microprocessor in accordance with the invention includes thermal sensing circuitry 20 that monitors a temperature of a substrate of the microprocessor 200 and asserts a signal (called THERMAL_TRIP) when a predetermined temperature threshold is exceeded. The threshold may be changed, for example, by writing to a thermal setpoint register 84 to store a value that indicates a desired value for the threshold. Depending on the particular embodiment, the value may indicate either a desired change from a default thermal threshold or the desired thermal threshold value itself. In some embodiments, the thermal sensing circuitry 20 does not require an A/D converter, and because the thermal sensing circuitry 20 may be fabricated on the same die as the microprocessor 200, no software interaction may be required to initiate thermal corrective action.

Thus, the advantages of the above-described arrangement may include one or more of the following: only modification of existing sensor circuitry inside the microprocessor may be required; no additional pins may be required on the microprocessor; advanced configuration and power interface (ACPI) requirements may be met; and no analog-to-digital (A/D) converter may be required, thereby conserving die area and promoting greater sensing accuracy.

Figure 1:
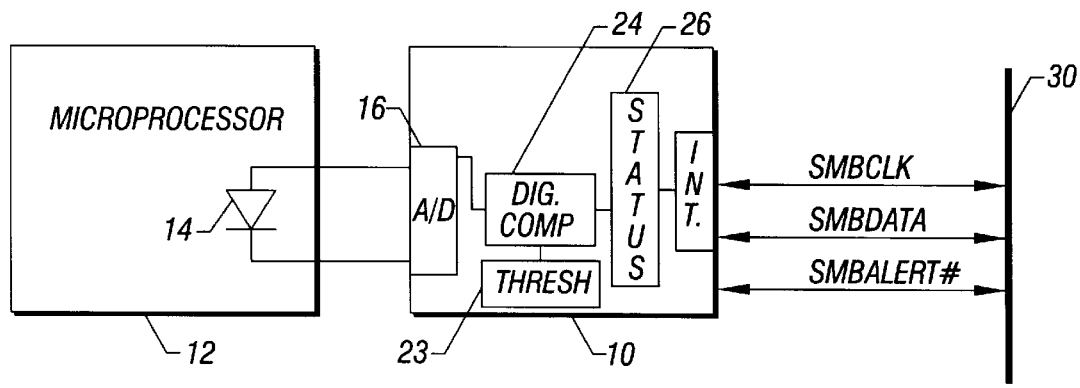
FIG. 1 is a schematic diagram of a system of the prior art to sense a substrate temperature of a microprocessor.
Figure 3:
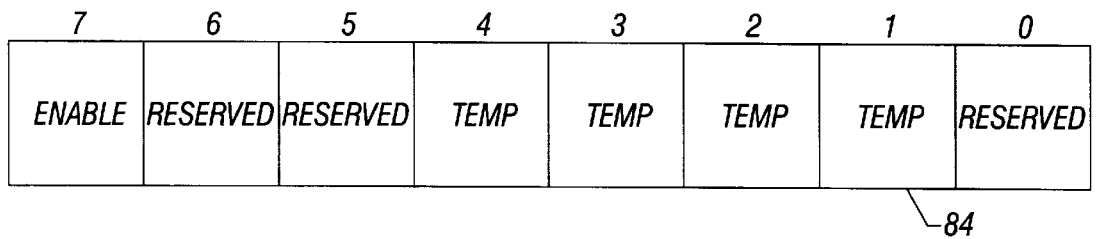
FIG. 3 is an illustration of bit assignments of a register of the microprocessor of FIG. 2.

Referring to FIG. 3, the thermal setpoint register 84 may be an eight bit register that includes bits (bits 1–4 of the register, for example) to indicate a desired change in the threshold. As an example, the register 84 may be programmed with a value to set the threshold at a temperature in the range of 100 degrees to 70 degrees with a resolution of approximately 2° C. However, alternatively, it may be desirable to use a default temperature threshold and thus, the register 84 may not be used. To inform the circuitry 20 when to use the value stored in the register 84 to change the default threshold, the register 84, in some embodiments, includes another bit (bit 7, for example) that indicates whether or not the default threshold is to be changed. In this manner, if the bit is set, then the bits of the register 84 are used to program the threshold. Conversely, if the bit is cleared (the default state of this bit), then the default threshold is used.

The register 84 furnishes signals that indicate the levels of selected bits. In particular, the logic levels of bits 1, 2, 3 and 4 (which indicate the desired threshold) of the register 84 are indicated by signals called TH[1], TH[2], TH[3] and TH[4], respectively. Collectively, these signals are represented by the notation TH[4:1]. The logic level of bit 7 (which indicates whether to use the default threshold or use the threshold specified by the value that is stored in the register 84) is indicated by a signal called TH[7].

Figure 4:
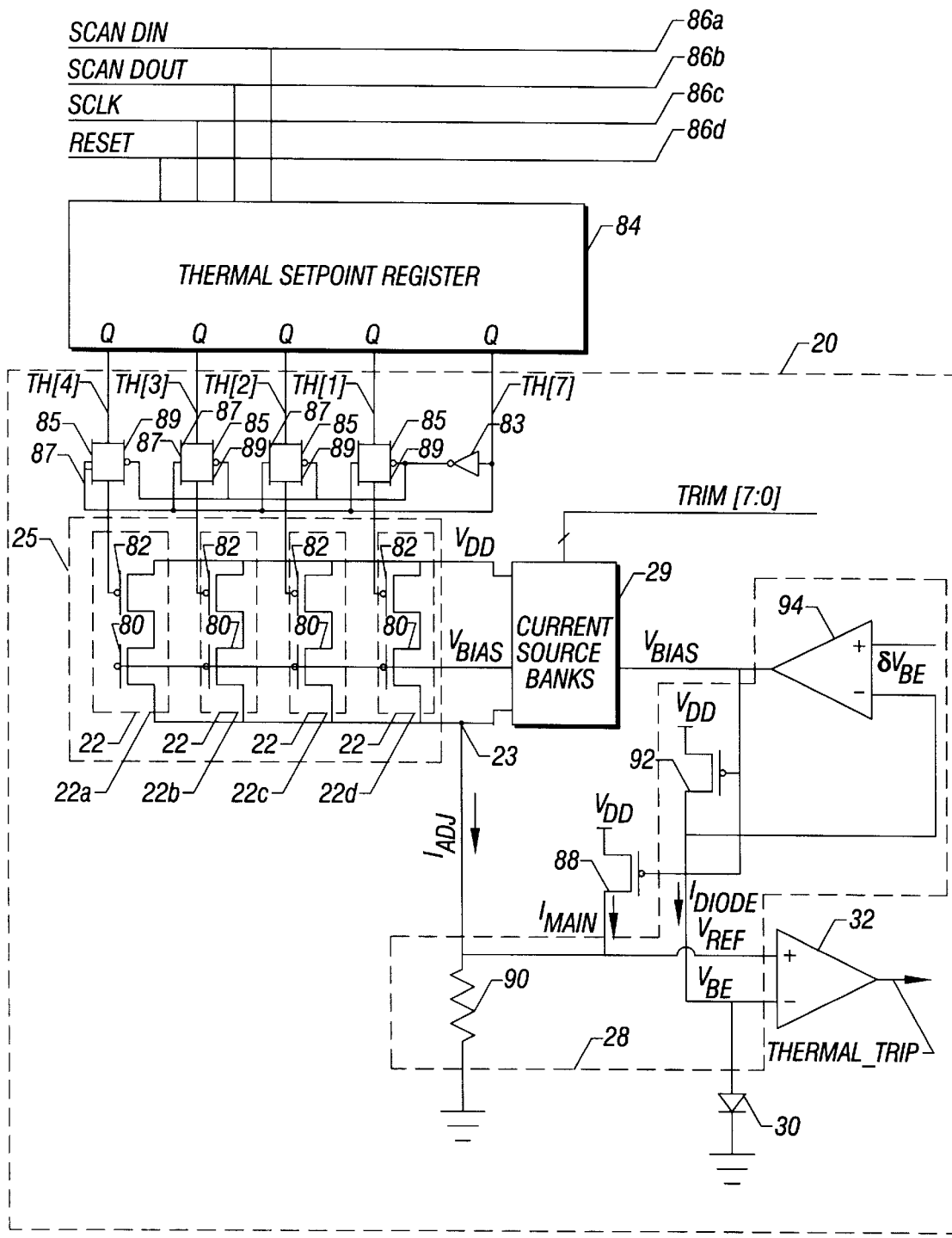
FIG. 4 is a schematic diagram of thermal sensing circuitry of the microprocessor of FIG. 2.

Referring to FIG. 4, in some embodiments, to generate the THERMAL_TRIP signal, the thermal sensing circuitry 20 may include an analog comparator 32 that is constructed to electrically compare a measured temperature of the substrate with the threshold. In this manner, the comparator 32 receives a $V_{REF}$ signal (that indicates the threshold) and a signal (called $V_{BE}$) that is indicative of the temperature of the substrate. The comparator 32 compares the voltage levels of these two signals, and based on the comparison, the comparator 32 either asserts, or drives high, the THERMAL_TRIP signal (to indicate an over temperature condition) or deasserts, or drives low, the THERMAL_TRIP signal (to indicate the temperature is normal).

The $V_{BE}$ signal represents the forward voltage across a pn junction (represented by a diode 30) of the substrate. As is typical, the forward potential across a pn junction varies approximately linearly and inversely with respect to temperature. As a result, as the temperature of the substrate rises, the voltage level $V_{BE}$ drops. The $V_{REF}$ signal is generated by a voltage reference circuit 28 of the thermal sensing circuitry 20. The voltage reference circuit 28 is constructed to set the $V_{REF}$ signal at a predetermined trip point voltage level that indicates the default threshold, and the predetermined trip point voltage level may be adjusted by the value stored in the register 84 to indicate a threshold other than the default threshold.

The threshold may be set to a predetermined default value (100° C., for example) by setting an $I_{MAIN}$ current to a predetermined level, as the $I_{MAIN}$ current flows through the resistor 90. However, an additional current (called $I_{ADJ}$) also flows through the resistor 90 and, as described below, may be used to adjust the threshold based on the states of the TH[4:1] signals.

More specifically, the level of the $I_{ADJ}$ current may be adjusted by current sources 22 (current sources 22a, 22b, 22c and 22d, as examples) that are selectively enabled by the TH[4:1] signals (when the register 84 asserts, or drives high, the TH[7] signal). In this manner, in some embodiments, each of the TH[4:1] signals is associated with one of the current sources 22, and the logical level of the signal controls the enablement of the associated current source 22. For example, the TH[4] signal may control the enablement of the current source 22a. In some embodiments, if the bit represented by the TH[4] signal has a logic zero level, then the register 84 may deasssert, or drive low, the TH[4] signal to disable the current source 22a. Conversely, if the bit represented by the TH[4] signal has a logic one level, then the register 84 may assert, or drive high, the TH[4] signal to enable the current source 22a.

The voltage reference circuit 28 tracks changes in the level of the $I_{ADJ}$ current by making corresponding linear adjustments in the voltage level of the $V_{REF}$ signal. In some embodiments, in order to cause the current sources 22 to contribute to the $I_{ADJ}$ current (and thus, change the threshold from the default value), the enable bit (bit 7) of the register 84 must be set. When set, the corresponding asserted TH[7] signal causes complementary metal-oxide-semiconductor (CMOS) transmission gates 85 to conduct and couple associated TH[4:1] signals to the current sources 22.

Each transmission gate 85 is formed from an N-channel metal-oxide-semiconductor (NMOS) transistor 87 and a P-channel metal-oxide-semiconductor (PMOS) transistor 89 that have their drain-source paths coupled in parallel. The gate terminal of the transistor 87 receives the TH[7] signal, and the gate terminal of the transistor 89 receives an inverted TH[7] signal that is provided by an inverter 83. The input terminal of the inverter 83 receives the TH[7] signal.

As described further below, one of the current sources 22 may be enabled to increase the level of the $I_{ADJ}$ current, and likewise, one of the current sources 22 may be disabled to decrease the level of the $I_{ADJ}$ current. In some embodiments, the thermal sensing circuitry 20 is designed for the voltage level of the $V_{REF}$ signal to indicate the predetermined default threshold when some of the current sources 22 are enabled. As a result, when the threshold is changed, the current sources 22 that were designed to be enabled might be disabled to lower the voltage level of $V_{REF}$ signal to the desired threshold.

Because the $V_{REF}$ signal is coupled to a non-inverting input terminal of the comparator 32 and the $V_{BE}$ is coupled to an inverting input terminal of the comparator 32, increasing the level of the $I_{ADJ}$ current (i.e., increasing the voltage level of the $V_{REF}$ signal) effectively lowers the temperature threshold. Decreasing the level of the $I_{ADJ}$ current (i.e., decreasing the voltage level of the $V_{REF}$ signal) effectively raises the temperature threshold.

In some embodiments, each current source 22, when enabled, furnishes the same, predetermined level (e.g., 1 uA) of current. As a result, because the threshold varies linearly with the level of the $I_{ADJ}$ current, for each current source 22 enabled or disabled, the threshold may change by a predetermined temperature unit (1° or 2° C., as examples).

In other embodiments, each current source 22 is constructed to provide a different level of current. For example, in some embodiments, the current levels furnished by current sources 22 are weighted to implement an 8-4-2-1 binary weighting scheme. In these embodiments, the current sources 22 supply a multiple of a predetermined current Io (e.g., 1 ua). For example, the current source 22c, when enabled, furnishes twice as much current (2 Io) as the current source 22d (which furnishes a current Io, when enabled). The current source 22b, when enabled, furnishes four times (4 Io) as much current as the current source 22d, and the current source 22a, when enabled, furnishes eight times as much current (8 Io) as the current source 22d. In the rest of the description, it is assumed that the current sources 22 implement the 8-4-2-1 binary weighting scheme.

Thus, due to the above-described arrangement, the current sources 22 may collectively function as a digital-to-analog (D/A) converter by converting the value indicated by bits of the register 84 into respective analog, output currents that are combined at the node 23 to form the $I_{ADJ}$ current.

For purposes of adjusting the threshold to account for process variations, the thermal sensing circuitry 20 may include one or more additional bank(s) 29 of current sources, each of which is of similar design to the bank of current sources 22a, 22b, 22c and 22d and are capable of contributing to the $I_{ADJ}$ current when enabled. In this manner, disregarding the effects of the current sources 22, the $V_{REF}$ voltage may indicate a temperature other than the default threshold due to process variations. To adjust the $V_{REF}$ voltage to accurately indicate the default temperature threshold, the current sources in this bank(s) 29 are selectably enabled via signals (called TRIM[7:0]) that are provided by another register (not shown).

In some embodiments, each current source 22 may include a PMOS transistor 80 that has a source-drain path that is serially coupled to the source-drain path of a PMOS selection transistor 82. The transistor 80 receives a bias voltage (called $V_{BIAS}$) at its gate and is coupled in a current mirror arrangement with the other transistors 80 of the other current sources 22, as the other transistors 80 have their sources coupled to the $V_{DD}$ supply voltage level through the source-drain paths of the transistors 82. The $V_{BIAS}$ voltage establishes the current flowing through the source-drain path of the transistor 80 when the current source 22 is enabled. The aspect ratios of the transistors 80 are scaled to implement the 8-4-2-1 binary weighting scheme.

The drain of the selection transistor 82 is coupled to the source of the transistor 80, and the source of the transistor 82 is coupled to a voltage supply level called $V_{DD}$. The selection transistor 82 receives the associated one of the TH[4:1] signals. When the signal is low, the source-drain path of the transistor 82 conducts which permits current to flow through the source-drain path of the transistor 80.

The voltage reference circuit 28 uses a bandgap reference circuit which minimizes thermal drift of the reference circuit 28 by compensating the positive drift temperature coefficient of a resistor 90 (e.g., an n-well resistor) with the negative drift temperature coefficient of the diode 30 (i.e., the pn junction).

The voltage $V_{REF}$ signal is provided by the voltage drop across the resistor 90. The resistor 90 is coupled between the node 23 and ground. Current flowing through the resistor 90 is furnished both by the $I_{ADJ}$ current and a main current (called $I_{MAIN}$). The $I_{MAIN}$ current is furnished by a PMOS transistor 88. The source-drain path of the transistor 88 is coupled between the supply voltage $V_{DD}$ and the node 23, and the gate of the transistor 88 receives the voltage $V_{BIAS}$.

A PMOS transistor 92 of the circuit 28 furnishes a current (called $I_{DIODE}$) to forward bias the diode 30 (i.e., to forward bias the pn junction). The source of the transistor 92 is coupled to the supply voltage $V_{DD}$, and the drain of the transistor 92 is coupled to the anode of the diode 30.

An amplifier 94 of the circuit 28 has a common mode configuration. An inverting input terminal of the amplifier 94 is coupled to the drain of the transistor 92, and the non-inverting input of the amplifier 94 is coupled to the anodes of forward biased diodes (not shown) that have their cathodes coupled to ground. These diodes have a similar design to the diode 30. Based on the voltage difference between the non-inverting and inverting input terminals, the amplifier 94 furnishes the $V_{BIAS}$ voltage. The comparator 32 compares the voltage levels of the $V_{REF}$ and $V_{BE}$ signals to generate the THERMAL_TRIP signal at its output terminal.

For purposes of interacting with the register 84, data and control lines are coupled to the register 84. Data is loaded into and retrieved from the register 84 via a serial scan chain arrangement. In this manner, the register 84 is serially linked to other test registers by a scan data input line 86a and a scan data output line 86b. The register 84 is also coupled to a clock line 86c and a reset line 86d.

Referring back to FIG. 2, in some embodiments, the microprocessor 200 includes a processing core 215 that processes data of a computer system. Outside of the processing core 215, the microprocessor 200 includes the bus interface unit 208, a pad interface 211, and a clock generator 210. The bus interface unit 208 provides an interface between internal buses of the microprocessor 200 and external buses that are used to fetch data and instructions from a memory of the computer system. The bus interface 208 has write buffers 209 that are used to store data to be transferred from the microprocessor 200 to the rest of the computer system. The pad interface 211 provides a pin interface for control, address and data signals passed between the microprocessor 200 and the rest of the computer system.

The clock generator 210 receives a system clock signal (called CLK_SYS) and uses the CLK_SYS to generate clock signals for the microprocessor 200. The clock generator 210 furnishes a clock signal (called CLK_1X) to the bus interface unit 208 and the pad interface 211. When the microprocessor 200 is not overheating (as indicated by the deassertion of the THERMAL_TRIP signal), the CLK_1X signal has the same frequency as the CLK_SYS signal, and portions of the bus interface unit 208 that interact with the pad interface 211 use the CLK_1X signal.

The clock generator 210 furnishes another clock signal (called CLK_INTERNAL) to the processing core 215. The CLK_INTERNAL signal is synchronized to the CLK_SYS signal and has a frequency that is a multiple (e.g., a multiple of two) of the frequency of the CLK_SYS signal. As a result, when the microprocessor 200 is operating under normal conditions, the processing core 215 generally operates at a higher frequency than the rest of the computer system.

Control logic 212 of the clock generator 210 receives the THERMAL_TRIP signal. When the THERMAL_TRIP signal is asserted, the control logic 212, depending on its configuration, alters the frequency of the CLK_INTERNAL signal to slow down the processing core 215 and reduce thermal buildup in the substrate of the microprocessor 200. In this manner, when the THERMAL_TRIP signal is asserted, the control logic 212 either throttles back the frequency of the CLK_INTERNAL signal or temporarily halts the CLK_INTERNAL signal.

In some embodiments, the clock generator 210 stops the microprocessor 200 for a predetermined duration (e.g., 50 $\mu$s) when the substrate overheats to allow the microprocessor 200 to cool down. Afterwards, the clock generator 210 allows operations of the microprocessor 200 to start again for a predetermined duration (e.g., 50 $\mu$s). At the end of this duration, the clock generator 210 checks the state of the THERMAL_TRIP signal, and if the THERMAL_TRIP signal is asserted, the on/off cycle is repeated.

While the invention has been disclosed with respect to a limited number of embodiments, those skilled in the art, having the benefit of this disclosure, will appreciate numerous modifications and variations therefrom. It is intended that the appended claims cover all such modifications and variations as fall within the true spirit and scope of the invention.

What is claimed:

1. An apparatus for use with a semiconductor substrate, comprising:

a digital interface to store a value indicative of a desired thermal threshold;

a digital-to-analog converter to provide an analog signal indicative of the value; and a thermal sensor circuit to use the analog signal to set the desired thermal threshold and indicate when a temperature of the substrate exceeds the thermal threshold.

2. The apparatus of claim 1, wherein the value indicates a change to a pre-existing thermal threshold.

3. The apparatus of claim 1, wherein the digital-to-analog converter comprises:

current sources to be selectably enabled by the digital interface.

4. The apparatus of claim 3, wherein the current sources are configured to implement a binary weighting scheme.

5. The apparatus of claim 3, wherein at least one of the current sources comprises:

a first transistor to provide a predetermined current when enabled.

6. The apparatus of claim 5, wherein said at least one current source further comprises:

a second transistor coupled to selectively enable the first transistor.

7. The apparatus of claim 1, wherein the digital interface comprises:

a register to store the value.

8. The apparatus of claim 1, wherein the thermal sensor circuit includes:

a reference circuit to use the analog signal to provide a threshold signal indicative of the thermal threshold;

a thermal sensing element to provide a thermal signal indicative of the temperature; and a comparator to compare the thermal signal with the threshold signal and indicate the result of the comparison.

9. The apparatus of claim 8, wherein the analog signal comprises a current and the reference circuit comprises a resistor to provide the threshold signal.

10. The apparatus of claim 9, wherein the threshold signal comprises a voltage of the resistor.

11. The apparatus of claim 8, wherein thermal sensing element comprises a diode.

12. A method for use with a semiconductor substrate, comprising:

storing a value indicative of a desired thermal threshold;

providing an analog signal indicative of the value;

using the analog signal to provide a threshold signal indicative of the thermal threshold;

providing a thermal signal indicative of a temperature of the substrate;

comparing the thermal signal with the threshold signal; and indicating the result of the comparison.

13. The method of claim 12, wherein the value indicates a change to a pre-existing thermal threshold.

14. The method of claim 12, wherein the act of providing the analog signal comprises:

selectably enabling current sources.

15. A microprocessor comprising:

a processing core to execute instructions in synchronization with a clock signal, the clock signal having a frequency;

a clock generator to furnish the clock signal and change the frequency in response to an indication of a thermal event;

a digital interface to store a value indicative of a desired thermal threshold;

a digital-to-analog converter to provide an analog signal indicative of the value; and a thermal sensor circuit to use the analog signal to set the desired thermal threshold and indicate when a temperature of the substrate exceeds the thermal threshold.

16. The microprocessor of claim 15, wherein the value indicates a change to a pre-existing thermal threshold.

17. The microprocessor of claim 15, wherein the digital-to-analog converter comprises:

current sources to be selectably enabled by the digital interface.

18. The microprocessor of claim 17, wherein the current sources are configured to implement a binary weighting scheme.

19. The microprocessor of claim 18, wherein at least one of the current sources comprises:

a first transistor to provide a predetermined current when enabled.

20. The microprocessor of claim 19, wherein said at least one current source further comprises:

a second transistor coupled to selectably enable the first transistor.

21. The microprocessor of claim 15, wherein the thermal sensor circuit includes:

a reference circuit to use the analog signal to provide a threshold signal indicative of the thermal threshold;

a thermal sensing element to provide a thermal signal indicative of the temperature; and a comparator to compare the thermal signal with the threshold signal and indicate the result of the comparison.

22. The microprocessor of claim 15, wherein the processing core, the clock generator, the digital interface, the digital-to-analog converter and the thermal sensor circuit are fabricated on a single semiconductor substrate.

23. An apparatus, comprising:

a digital interface fabricated on a semiconductor substrate to store a value indicative of a desired thermal threshold;

a digital-to-analog converter fabricated on the semiconductor substrate to provide an analog signal indicative of the value; and a thermal sensor circuit fabricated on the semiconductor substrate to use the analog signal to set the desired thermal threshold and indicate when a temperature of the substrate exceeds the thermal threshold.

24. The apparatus of claim 23, further comprising:

a microprocessor fabricated on the semiconductor substrate.

25. The apparatus of claim 23, wherein the value indicates a change to a pre-existing thermal threshold.

26. The apparatus of claim 23, wherein the digital-to-analog converter comprises:

current sources to be selectably enabled by the digital interface.

27. The apparatus of claim 23, wherein the digital interface comprises:

a register to store the value.

* * * * *